United States Patent [19]

Scott

[11] Patent Number: 5,239,210
[45] Date of Patent: Aug. 24, 1993

[54] LOW DISTORTION UNITY GAIN AMPLIFIER FOR DAC

[75] Inventor: Jeffrey W. Scott, Austin, Tex.

[73] Assignee: Crystal Semiconductor, Inc., Austin, Tex.

[21] Appl. No.: 642,280

[22] Filed: Jan. 15, 1991

[51] Int. Cl.$^5$ .............................................. H03K 5/22
[52] U.S. Cl. ..................................... 307/355; 307/491; 307/360; 330/258
[58] Field of Search ................ 307/355, 362, 475, 360, 307/491; 330/258

[56] References Cited

U.S. PATENT DOCUMENTS

| | | | |
|---|---|---|---|
| 4,147,943 | 4/1979 | Peterson | 307/355 |
| 4,468,628 | 8/1984 | Gross | 330/258 |
| 4,658,159 | 4/1987 | Miyamoto | 307/355 |
| 4,868,417 | 9/1989 | Jandu | 307/355 |
| 4,901,031 | 2/1990 | Kalthoff et al. | 330/258 |
| 4,916,338 | 4/1990 | Metz | 307/355 |
| 4,962,323 | 10/1990 | Ta | 307/355 |

Primary Examiner—William L. Sikes
Assistant Examiner—Toan Tran
Attorney, Agent, or Firm—Gregory M. Howison

[57] ABSTRACT

A unity gain buffer for a DAC is provided that is disposed on the output of a switched-capacitor filter and sampled data/continuous time buffer. The unity gain buffer provides low-distortion operation with a high input impedance. Differential input transistors (190) and (200) are provided having the source thereof connected to a common source node (202). A current source transistor (214) provides a current source between node (202) and ground. Each of the drains of transistors (190) and (200) have a constant current source provided thereto by transistors (222) and (230). Cascode devices (216) and (226) are disposed in the drains of transistors (190) and (200) to maintain a constant $V_{DS}$ during large input common-mode conditions. Any bias variations in transistor (214) are absorbed by feedback transistors (232) and (234), which provide a variable current source to node (202). These are controlled by the voltages on the drains of transistors (190) and (200).

12 Claims, 2 Drawing Sheets

LOW DISTORTION UNITY GAIN AMPLIFIER FOR DAC

TECHNICAL FIELD OF THE INVENTION

The present invention pertains in general to switched capacitor filters, and more particularly, to a digital-to-analog converter utilizing a switched-capacitor filter and an active filter for filtering the output of the switched capacitor filter.

CROSS-REFERENCE TO RELATED APPLICATION

This application is co-pending with U.S. patent application Ser. No. 07/641,183, entitled, "Switched-Capacitor Filter with DAC Input", U.S. patent application Ser. No. 07/641,876, , entitled "Switched Capacitor to Continuous Time Buffer for DAC", and U.S. patent application No. 07/641,182, entitled "Low Distortion Amplifier Output Stage for DAC".

BACKGROUND OF THE INVENTION

In conventional digital-to-analog converters, a first conversion stage is followed by multiple stages of low-pass filtering to filter out unwanted noise. In one type of digital-to-analog converter, a digital delta-sigma modulator is utilized. The delta-sigma modulator receives a digital input and converts it into a one-bit digital output. This output is typically passed through a one-bit DAC and then into an active RC low pass filter. The active RC low pass filter utilizes a series of resistors and various active components in order to realize the desired filter function. The disadvantage to this type of filter is the sensitivity of the filter to variations in the components. A significant amount of trimming is often required.

In another type of filtering scheme, a switched-capacitor filter has been optimized. However, noise performance of this type of filter has not been optimized to its fullest due to the fact that switched-capacitor filters in DACs utilizing delta-sigma modulators have been realized with cascaded bi-quad switched-capacitor filters. The disadvantage to this is that the multiple bi-quad stages add a significant noise component to the overall filter function, which is undesirable.

A problem exists with conventional digital-to-analog converters utilizing any type of switched capacitor filter is the requirement for conversion from the sampled data domain on the output of the switched capacitor filter to a continuous time domain. In the past, an active filter has been utilized to directly convert between the sampled data output by the switched capacitor and a continuous time output. However, this conversion typically results in a high degree of distortion that is added to the signal. Any distortion, especially in low level DACs, is detrimental to the overall performance.

SUMMARY OF THE INVENTION

The present invention disclosed and claimed herein comprises a unity gain buffer circuit. This buffer includes first and second differential input transistors for receiving a differential gate voltage on respective gate terminals. Each of the source/drain paths to the transistors are connected on one side thereof to a common node. A first common current source is provided that is connected to the other side of the source/drain path of the first differential transistor and operable to supply a first substantially constant current thereto. A second constant current source is provided that is connected to the other side of the source/drain path of a second differential transistor and is operable to provide a second substantially constant current. A common current source is provided for sinking current from the common node to a reference supply.

In another aspect of the present invention, a variable current source is provided for generating a variable source of current to the common node. Control circuitry senses the current through the first and second transistors and varies the variable current to maintain the currents through the first and second transistors substantially constant and independent of variations in the common current source.

In yet another aspect of the present invention, the first and second transistors are n-channel transistors. A first cascode transistor is provided in series with the first constant current source and the drain of the first n-channel transistor. A second cascode transistor is disposed in series with the second constant current source and the drain of the second n-channel transistor. The gates of the cascode transistors are tied together and to a dynamic bias circuit.

In a yet further aspect of the present invention, the variable current source and the control circuit comprise first and second p-channel transistors having the source/drain paths thereof connected on one side to a common node. The other side of the source/drain paths are connected to a positive supply. The gate of the first p-channel transistor is connected to the drain of the first n-channel transistor and the gate of the second p-channel transistor is connected to the drain of the second n-channel transistor. The first and second p-channel transistors provide two separate current sources that are controlled by the drain of the respective n-channel transistors.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
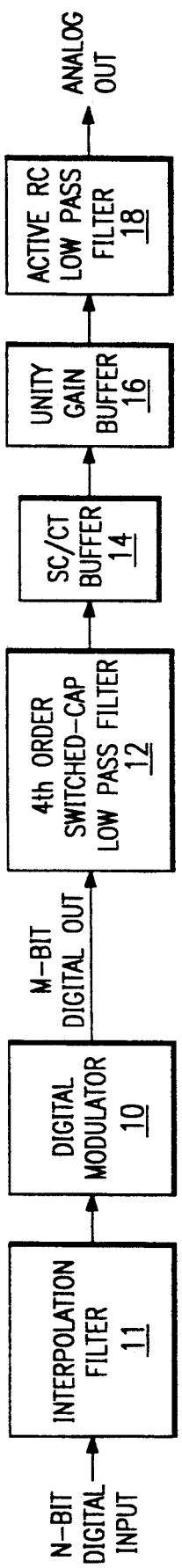
FIG. 1 illustrates an overall block diagram of a low noise/low distortion switched-capacitor/continuous time filter.

Referring now to FIG. 1, there is illustrated an overall block diagram of a digital-to-analog converter (DAC) utilizing a low noise/low distortion switched-capacitor/continuous time filter. An n-bit digital input is received on the input of an interpolation filter 11, the output of which is input to a digital modulator 10 that is operable to convert the n-bit input to an m-bit digital output, m being less than n. In the preferred embodiment, the digital modulator 10 is comprised of an oversampling and noise shaping circuit utilizing a delta-sigma digital modulator that effectively converts the n-bit digital word to an m-bit digital output. In the preferred embodiment, m is equal to a value of "one". This is described in U.S. patent application Ser. No. 571,376, filed Aug. 22, 1990, and entitled "Phase Equalization System for a Digital-To-Analog Converter", which is incorporated herein by reference. However, it should be understood that a multi-bit output digital modulator could be utilized.

Although a delta-sigma modulator is utilized in the preferred embodiment, it should be understood that any type of one-bit digital modulator or equivalent can be utilized to provide the conversion from an n-bit digital word to a one-bit digital stream. The delta-sigma modulator is utilized as it provides good low level performance and differential non-linearity. The general operation of the digital modulator 10 is known in the art and described in Yasuykui Matsuia, Kuniharu Uchimura, Atsushi Awaiti and Takayo Kaneko, "A 17-Bit Oversampling D-To-A Conversion Technology Using Multi-Stage Noise Shaping", IEEE J. of Solid-State Circuits, Vol. 24, No. 4, August 1989, which is incorporated herein by reference and V. Friedman, et. al. "A Dual-Channel Voice-Band PCM Codec Using $\Sigma\Delta$ Modulation Technique", IEEE Journal of Solid State Circuits, Vol. 24, No. 2, April 1989, which is incorporated herein by reference.

The one-bit digital stream output by the digital modulator 10 is input to a fourth order switched-capacitor low pass filter 12. The filter 12 is a Butterworth filter which has integral with the input thereof a one-bit DAC, as will be described hereinbelow. The output of the filter 12 is input to a switched-capacitor/continuous time buffer 14 that converts the switched-capacitor output of the filter 12 into a continuous time format with relatively low distortion. This is then input to a high impedance, low distortion unity gain buffer 16, the output of which is input to an active RC low-pass filter 18. The output of the active RC low-pass filter 18 provides the low impedance analog output of the overall digital-to-analog converter of FIG. 1.

Figure 2:
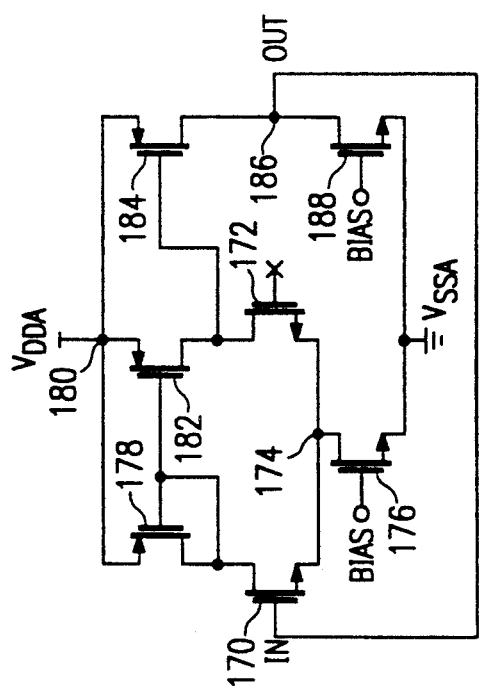
FIG. 2 illustrates a schematic diagram of a prior art unity gain buffer.

Referring now to FIG. 2, there is illustrated a schematic diagram of a prior art unity gain buffer. Two differential input transistors 170 and 172 are provided, having the sources thereof connected to a common node 174. The node 174 is connected through the source/drain path of an N-channel transistor 176 to a supply voltage $V_{SSA}$. The gate thereof is connected to a bias voltage, transistor 176 acting as a current source. The drain of transistor 170 is connected to one side of the source/drain path of a P-channel transistor 178, the other side of which is connected to a positive supply voltage $V_{DDA}$, a node 180. The gate and drain of transistor 178 are connected together. In a similar manner, the drain of transistor 172 is connected to one side of the source/drain path of a transistor 182, the other side of which is connected to the node 180. The gate of transistor 182 is connected to the gate of transistor 178. The gate of transistor 170 comprises the negative input and the gate of transistor 172 comprises the positive input, the drain of transistor 172 also providing the output of the differential amplifier which is connected to the gate of an output driver transistor 184, which is a P-channel transistor, which has one side of the source/drain path thereof connected to node 180 and the other side thereof connected to an output node 186. The output node 186 is connected back to the gate of transistor 170, which is the input of the amplifier. A current source transistor 188 is provided, having the source/drain path thereof connected between node 186 and the voltage $V_{SSA}$. The gate of transistor 188 is connected to a bias voltage.

A large common mode signal at the differential pair input, transistors 170 and 172, of the prior art amplifier of FIG. 11, introduces two distortion mechanisms. The first is due to the large signal change in the drain-to-source voltage ($V_{DS}$) of the differential pair devices 170 and 172. If there is a mismatch in the $I_D$ vs. $V_{DS}$ or output conductance characteristics of these devices, a difference in the gate-to-source voltage $V_{GS}$ of these devices must be introduced in order to maintain equal drain currents ($I_D$). This $V_{GS}$ difference can manifest itself as distortion in the buffer input/output characteristics. The second distortion mechanism present in the prior art amplifier/buffer under large, common-mode signal conditions is due to the large signal change in the drain-to-source voltage of the current source transistor 176. Because of the finite output impedance of transistor 176, the $V_{DS}$ change of transistor 176 will cause the differential pair bias current to vary with input signal. If there is a mismatch in the $I_D$ vs. $V_{GS}$ or transconductance characteristics of the differential pair devices, a difference in the gate-to-source voltage of these devices must again be introduced in order to maintain an equal current balance. It is important to point out, since both of these distortion mechanisms occur at the amplifier differential input stage, no amount of open loop amplifier gain will reduce these effects during closed loop operations.

Figure 3:
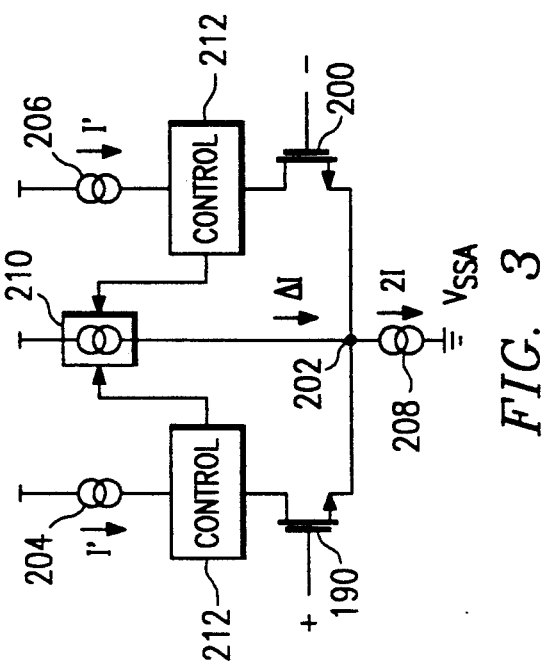
FIG. 3 illustrates a simplified schematic diagram of the unity gain buffer.

Referring now to FIG. 3, there is illustrated a simplified schematic diagram of the unity gain buffer of the present invention. Two differential input devices 190 and 200 are provided, both N-channel devices having the sources thereof connected to a common node 202. The gate of transistor 190 is a positive input of the buffer and the gate of transistor 200 is a negative input. A current source 204 is connected to the drain of transistor 190 to provide a current I'. Similarly, a current source 206 is connected to the drain of transistor 200 and provides an equal current I'. A current source 208 is connected between the common node 202 and the supply voltage $V_{SSA}$ and provides a current sink of 2I. Another current source, current source 210 is provided that is connected directly to the node 202 to provide a current $\Delta I$. The current source 210 is controlled by two control boxes 212 that are disposed between the respective drains of transistors 190 and 200 and the respective current sources 204 and 206 to sense the currents therethrough. Control boxes 212 control current source 210 to adjust the value of $\Delta I$ to maintain the current through transistors 190 and 200 at a constant $I_D$ independent of current variations in current source 208. Therefore, the input differential pair of transistors 190 and 200 are operated in a constant $I_D$ mode, even under large input common-mode signal conditions. The current sources 204 and 206 are operable to force equal drain currents in the two transistors 190 and 200, while the current source 210 is operable to absorb the current difference at the common node 202.

Figure 4:
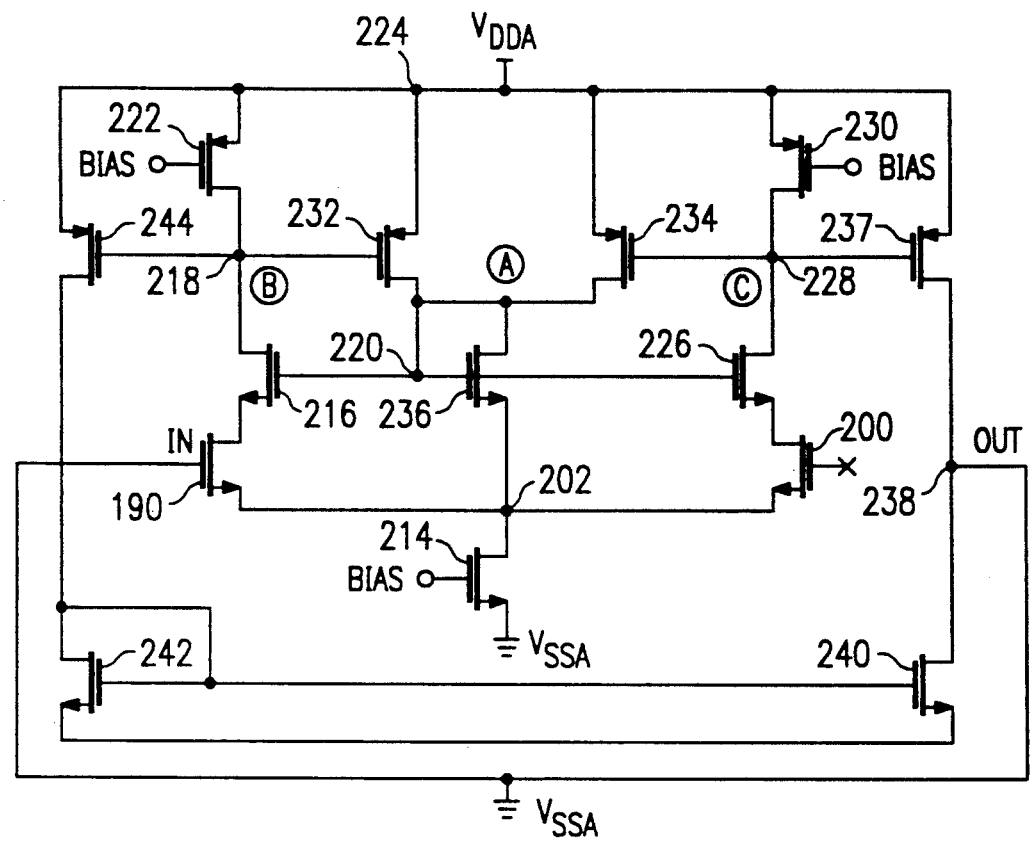
FIG. 4 illustrates a detailed schematic diagram of the unity gain buffer.

Referring now to FIG. 4, there is illustrated a more detailed schematic diagram of the unity gain buffer of the present invention. The common source node 202 is connected to one side of the source/drain path of a transistor 214, the other side of which is connected to $V_{SSA}$. Transistor 214 corresponds to current source 208. The gate thereof is connected to a bias voltage. The drain of transistor 190 is connected through the source/drain path of a cascode N-channel transistor 216 to a node 218. The gate of transistor 216 is connected to a dynamic bias node 220. Node 218 is connected to one side of the source/drain path of a P-channel transistor 222, the other side of which is connected to a supply node 224, which is connected to $V_{DDA}$. The gate of transistor 222 is connected to a bias voltage and functions as current source 204. In a similar manner, the drain of transistor 200 is connected through the source/drain path of an N-channel cascode transistor 226 to a node 228. The gate of transistor 226 is connected to the node 220. Node 228 is connected to one side of the source/drain path of a P-channel transistor 230, the other side of which is connected to the node 224. The gate of transistor 230 is connected to a bias voltage, transistor 230 functioning as current source 206.

A P-channel feedback transistor 232 has one side of the source/drain path thereof connected to node 224 and the other side thereof connected to node 220. The gate of transistor 232 is connected to node 218. Similarly, a P-channel feedback transistor 234 has one side of the source/drain path thereof connected to the node 224 and the other side thereof connected to the node 220. The gate of transistor 234 is connected to node 228. An N-channel transistor 236 is provided having the drain and gate thereof connected together and to node 220 and the source thereof connected to node 202 to provide the current ΔI to node 202 and also provide the dynamic gate bias for transistors 216 and 226.

The node 228 is connected to the gate of the P-channel transistor 237, the source/drain path thereof connected between the node 224 and an output node 238. Similarly, node 238 is connected to one side of the source/drain path of an N-channel transistor 240, the other side of which is connected to $V_{SSA}$. The gate of transistor 240 is connected to the gate of a second N-channel transistor 242, the gate and drain thereof connected together and the source connected to $V_{SSA}$ to function as a current mirror. The gate-drain of transistor 242 is connected to one side of the source/drain path of a P-channel transistor 244, the other side thereof connected to the node 224. The gate of transistor 244 is connected to node 218. Transistors 237, 240, 242 and 244 function as the second stage of amplification to provide a general turn-around output stage. The transistors 240 and 242 are just a current mirror whereas transistors 237 and 244 provide the actual output stage, this structure being a two-stage amplifier. The output node 238 is connected to the gate of transistor 190, which constitutes the input of the amplifier.

In operation, the ΔI current is controlled by transistors 232 and 234 which provide the feedback operation. The transistors 216 and 226 are cascode devices with transistor 236 being a bias device. The transistors 216 and 226 ensure a constant differential pair $V_{DS}$ under large input, common-mode signal conditions. The shunt feedback transistors 232 and 234 are operable to absorb the current difference at the common source node 202. As the bias current in the transistor 214 changes due to finite output impedance, the gate-to-source voltage of the feedback transistors 232 and 234 will change to accommodate this current change, but the $V_{GS}$ change in transistors 232 and 234 will be lower by a factor of (gm/go)>>1(gm=transconductance of shunt feedback devices 232 and 234; go=output conductance of current source transistor 214). Consequently, the current source devices that really determine the input paired bias current of transistors 190 and 200 experience a $V_{DS}$ change substantially lower than the input common-mode signal.

Figure 5:
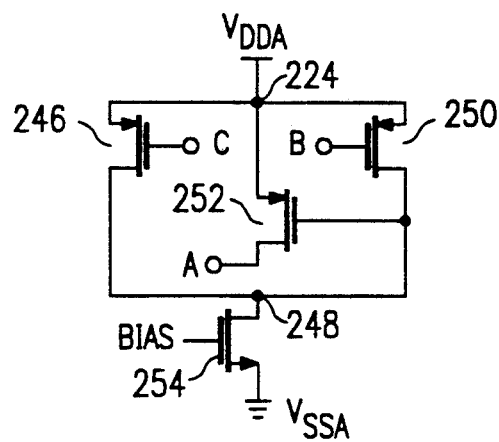
FIG. 5 illustrates a schematic of the start-up circuit for the unity gain buffer.

Referring now to FIG. 5, there is illustrated a start-up circuit for the buffer of FIG. 13. In FIG. 4, the node 218 is labelled "B", node 220 is labelled "A", and node 228 is labelled "C". A P-channel transistor 246 has the source/drain path thereof connected between the node 224 and a node 248. The gate of transistor 246 is connected to the connection "C" at node 220. A P-channel transistor 250 has the source/drain path thereof connected between the node 224 and node 248 and the gate thereof connected to connection "B" at node 218. A P-channel transistor 252 has the source/drain path thereof connected between node 224 and the connection "A" at node 228 and the gate thereof connected to the node 248. A transistor 254 has the source/drain path thereof connected between node 248 and $V_{SSA}$ and the gate thereof connected to a bias current. The circuit of FIG. 5 is operable to provide start-up current to node "A" upon initialization.

In summary, there has been provided a unity gain buffer for a digital-to-analog converter that utilizes a switched-capacitor filter. The switched-capacitor filter receives a one-bit digital stream on the input thereof and converts it to a one-bit sampled data analog value. This is filtered in the sampled data domain and then converted to the continuous time domain with a sampled data/continuous time buffer. A unity gain buffer is provided on the output of the sampled data/continuous time buffer that has a high input impedance and very low distortion. A differential input pair is provided on the input stage wherein the drain current for the input differential transistors is provided by separate constant current sources. The differential transistors are connected together at a common source node, which is connected to one side of a common current source. Variations in bias current under large input common-mode signal conditions is minimized by providing a separate and variable current source that is operable to absorb variations in current changes in the current source disposed between the common source node the low voltage reference. Further, cascode devices are provided on the drains of the differential input pair to maintain a constant drain-to-source voltage.

Although the preferred embodiment has been described in detail, it should be understood that various changes, substitutions and alterations can be made therein without departing from the spirit and scope of the invention as defined by the appended claims.

What is claimed is:

1. A differential input stage, comprising:
   first and second differential input transistors for receiving a differential voltage on respective gate terminals, and each having source/drain paths connected on one side thereof to a common node;
   a first constant current source for being connected to the other side of said first differential transistor and supplying a first substantially constant current thereto;
   a second constant current source for being connected to the other side of said second differential transistor and supplying a second substantially constant current thereto;
   a common current source for sinking current from said common node to a reference node;
   a variable current source for providing a variable source of current to said common node; and control circuitry interface with said first and second differential transistors for sensing the current through said first and second differential transistors, said control circuitry controlling said variable current source to vary said variable current source to maintain the currents through said first and second differential transistors substantially constant and independent of variations in said common current source.

2. The buffer circuit of claim 1 wherein said first and second current sources are substantially equal to each other.

3. The buffer circuit of claim 1 wherein the current through said common current source is equal to the sum of said first and second constant currents and said variable source of current.

4. The buffer circuit of claim 1 wherein said first and second differential input transistors are n-channel transistors with the source connected to said common node.

5. The buffer circuit of claim 4 and further comprising:
- a first cascode transistor having the source/drain path thereof disposed in series with said first constant current source and said first n-channel transistor; and
- a second cascode transistor having source/drain path thereof disposed in series with said second constant current source and said second n-channel transistor;
- the gates of said first and second cascode transistors tied together and to a dynamic bias circuit.

6. The buffer circuit of claim 5 wherein the output of said buffer circuit is connected to a second stage of amplification having an output, and the output of said second stage of amplification is connected back to the input of said buffer circuit to provide a unity gain operation.

7. The buffer circuit of claim 4 wherein and variable current source and said control circuit comprise:
- a first p-channel transistor having the source/drain path thereof connected between a positive supply and said common node through a diode-configured n-channel transistor;
- a second p-channel transistor having the source/drain thereof connected between the postive supply and said common node through said diode-configured n-channel transistor;
- the gate of said first p-channel transistor being connected to the drain of said first n-channel transistor; and
- the gate of said second p-channel transistor being connected to the drain of said second n-channel transistor.

8. A method for buffering an analog signal with low distortion, comprising:
- providing first and second differential transistors, each having a source/drain path which are each connected on one side to a common node, the gates of the first and second differential transistors comprising differential inputs;
- generating a first constant current source for input to the other side of the source/drain path of the first differential transistor and supplying a first substantially constant current;
- generating a second constant current source for input to the other side of the source/drain path of the second differential transistor and operable to supply a second substantially constant current thereto;
- generating a common current source for sinking a current from the common node to a reference
- generating a variable current source for providing a variable source of current to the common node;
- sensing the current through the first and second differential transistors; and
- varying the current through the variable current source to maintain the current through the first and second differential transistors independent of current variations through the common current source.

9. The method of claim 8 wherein the first and second differential transistors are n-channel transistors and the step of inputting the first constant current to the first transistor comprises inputting the first constant current source into the drain of the first n-channel transistor and the step of inputting the second constant current source comprises inputting the second constant current source into the drain of the second n-channel transistor.

10. The method of claim 9 and further comprising:
- providing a first cascode transistor;
- disposing the first cascode transistor in series with the first constant current source and the first n-channel transistor;
- providing a second cascode transistor;
- disposing the second cascode transistor between the second constant current source and the second n-channel transistor; and
- dynamically biasing the gates of the first and second cascode transistors.

11. The method of claim 8 wherein the first and second constant current sources are substantially equally to each other.

12. The method of claim 8 wherein the current through common current source is substantially equal to the sum of the currents through the first and second constant current sources and the variable current source.

* * * * *